(12) United States Patent
Karim et al.

(10) Patent No.: US 7,294,588 B2
(45) Date of Patent: Nov. 13, 2007

(54) IN-SITU-ETCH-ASSISTED HDP DEPOSITION

(75) Inventors: M. Ziaul Karim, San Jose, CA (US);
DongQing Li, Santa Clara, CA (US);
Jeong Soo Byun, Cupertino, CA (US);
Thanh N. Pham, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 11/388,657

(22) Filed: Mar. 24, 2006

(65) Prior Publication Data

US 2006/0166515 A1 Jul. 27, 2006

Related U.S. Application Data

(63) Continuation of application No. 11/089,874, filed on Mar. 25, 2005, now Pat. No. 7,049,211, which is a continuation of application No. 10/655,230, filed on Sep. 3, 2003, now Pat. No. 6,903,031.

(51) Int. Cl.
*H01L 21/31* (2006.01)
*H01I 21/469* (2006.01)

(52) U.S. Cl. ............... 438/787; 438/788; 438/778; 257/E21.279

(58) Field of Classification Search ........... 438/787, 438/788, 778, 758; 257/E21.279, E21.547
See application file for complete search history.

(56) References Cited

U.S. PATENT DOCUMENTS 4,572,841 A    2/1986   Kaganowicz et al.
5,270,264 A   12/1993   Andideh et al.
5,314,724 A    5/1994   Tsukune et al.

(Continued)

FOREIGN PATENT DOCUMENTS

EP        0 883 166 A3    9/1998

(Continued)

OTHER PUBLICATIONS

Abraham, Tom, "Reactive Facet Tapering Of Plasma Oxide For Multilevel Interconnect Applications," V-MIC Conference, IEEE, pp. 115-121, Jun. 15-16, 1987.

(Continued)

*Primary Examiner*—B. William Baumeister
*Assistant Examiner*—Igwe U. Anya
(74) *Attorney, Agent, or Firm*—Townsend and Townsend and Crew LLP

(57) ABSTRACT

A process is provided for depositing an silicon oxide film on a substrate disposed in a process chamber. A process gas that includes a halogen source, a fluent gas, a silicon source, and an oxidizing gas reactant is flowed into the process chamber. A plasma having an ion density of at least $10^{11}$ ions/cm$^3$ is formed from the process gas. The silicon oxide film is deposited over the substrate with a halogen concentration less than 1.0%. The silicon oxide film is deposited with the plasma using a process that has simultaneous deposition and sputtering components. The flow rate of the halogen source to the process chamber to the flow rate of the silicon source to the process chamber is substantially between 0.5 and 3.0.

13 Claims, 9 Drawing Sheets

U.S. PATENT DOCUMENTS

| | | | |
|---|---|---|---|
| 5,507,881 | A | 4/1996 | Sichanugrist et al. |
| 5,525,550 | A | 6/1996 | Kato |
| 5,589,233 | A | 12/1996 | Law et al. |
| 5,593,741 | A | 1/1997 | Ikeda |
| 5,614,055 | A | 3/1997 | Fairbairn et al. |
| 5,621,241 | A | 4/1997 | Jain |
| 5,629,043 | A | 5/1997 | Inaba et al. |
| 5,641,581 | A * | 6/1997 | Nishiyama et al. ......... 428/688 |
| 5,776,557 | A | 7/1998 | Okano et al. |
| 5,786,039 | A | 7/1998 | Brouquet |
| 5,807,785 | A | 9/1998 | Ravi |
| 5,849,455 | A | 12/1998 | Ueda et al. |
| 5,869,149 | A | 2/1999 | Denison et al. |
| 5,874,350 | A | 2/1999 | Nakagawa |
| 5,903,106 | A | 5/1999 | Young et al. |
| 6,004,831 | A | 12/1999 | Yamazaki et al. |
| 6,030,666 | A | 2/2000 | Lam et al. |
| 6,030,881 | A | 2/2000 | Papasouliotis et al. |
| 6,037,018 | A | 3/2000 | Jang et al. |
| 6,039,851 | A | 3/2000 | Iyer |
| 6,042,901 | A | 3/2000 | Denison et al. |
| 6,057,242 | A | 5/2000 | Kishimoto |
| 6,059,643 | A | 5/2000 | Hu et al. |
| 6,070,551 | A | 6/2000 | Li et al. |
| 6,071,573 | A | 6/2000 | Koemtzopoulos et al. |
| 6,074,959 | A | 6/2000 | Wang et al. |
| 6,077,786 | A | 6/2000 | Chakravarti et al. |
| 6,096,646 | A | 8/2000 | Lee et al. |
| 6,136,685 | A | 10/2000 | Narwankar et al. |
| 6,147,009 | A | 11/2000 | Grill et al. |
| 6,149,976 | A | 11/2000 | Matsuki et al. |
| 6,149,986 | A | 11/2000 | Shibata et al. |
| 6,167,834 | B1 | 1/2001 | Wang et al. |
| 6,170,428 | B1 | 1/2001 | Redeker et al. |
| 6,174,808 | B1 | 1/2001 | Jang et al. |
| 6,182,602 | B1 | 2/2001 | Redeker et al. |
| 6,184,158 | B1 | 2/2001 | Shufflebotham et al. |
| 6,189,483 | B1 | 2/2001 | Ishikawa et al. |
| 6,190,233 | B1 | 2/2001 | Hong et al. |
| 6,191,026 | B1 | 2/2001 | Rana et al. |
| 6,194,037 | B1 | 2/2001 | Terasaki et al. |
| 6,194,038 | B1 | 2/2001 | Rossman |
| 6,197,705 | B1 | 3/2001 | Vassiliev |
| 6,200,412 | B1 | 3/2001 | Kilgore et al. |
| 6,217,658 | B1 | 4/2001 | Orczyk et al. |
| 6,224,950 | B1 | 5/2001 | Hirata |
| 6,228,751 | B1 | 5/2001 | Yamazaki et al. |
| 6,230,650 | B1 | 5/2001 | Yamazaki |
| 6,232,196 | B1 | 5/2001 | Raaijmakers et al. |
| 6,255,207 | B1 | 7/2001 | Jang et al. |
| 6,313,010 | B1 | 11/2001 | Nag et al. |
| 6,326,064 | B1 | 12/2001 | Denison et al. |
| 6,335,288 | B1 | 1/2002 | Kwan et al. |
| 6,346,302 | B2 | 2/2002 | Kishimoto et al. |
| 6,372,291 | B1 | 4/2002 | Hua et al. |
| 6,383,896 | B1 | 5/2002 | Kirimura et al. |
| 6,395,150 | B1 | 5/2002 | Van Cleemput et al. |
| 6,410,457 | B1 * | 6/2002 | M'Saad et al. ............ 438/778 |
| 6,416,823 | B2 | 7/2002 | Li et al. |
| 6,465,044 | B1 | 10/2002 | Jain et al. |
| 6,486,437 | B2 | 11/2002 | Tanabe |
| 6,503,843 | B1 | 1/2003 | Xia et al. |
| 6,531,193 | B2 | 3/2003 | Fonash et al. |
| 6,537,929 | B1 | 3/2003 | Cheung et al. |
| 6,551,940 | B1 | 4/2003 | Ko |
| 6,559,026 | B1 | 5/2003 | Rossman et al. |
| 6,589,610 | B2 | 7/2003 | Li et al. |
| 6,589,611 | B1 | 7/2003 | Li et al. |
| 6,596,653 | B2 | 7/2003 | Tan et al. |
| 6,596,654 | B1 | 7/2003 | Bayman et al. |
| 6,607,983 | B1 | 8/2003 | Chun et al. |
| 6,626,188 | B2 | 9/2003 | Fitzsimmons et al. |
| 6,653,203 | B1 | 11/2003 | Huang et al. |
| 6,673,722 | B1 | 1/2004 | Yamazaki |
| 6,713,390 | B2 | 3/2004 | M'Saad et al. |
| 6,727,190 | B2 * | 4/2004 | Srinivasan et al. ......... 438/789 |
| 6,794,290 | B1 | 9/2004 | Papasouliotis et al. |
| 6,903,031 | B2 | 6/2005 | Karim et al. |
| 2001/0028924 | A1 | 10/2001 | Sherman |
| 2001/0033900 | A1 | 10/2001 | M'Saad et al. |
| 2002/0187655 | A1 * | 12/2002 | Tan et al. .................... 438/788 |
| 2002/0192396 | A1 | 12/2002 | Wang et al. |
| 2003/0056900 | A1 | 3/2003 | Li et al. |
| 2003/0159656 | A1 | 8/2003 | Tan et al. |
| 2003/0203637 | A1 | 10/2003 | Hua et al. |
| 2003/0219540 | A1 | 11/2003 | Law et al. |
| 2004/0146661 | A1 | 7/2004 | Kapoor et al. |
| 2004/0166694 | A1 | 8/2004 | Won et al. |
| 2005/0048801 | A1 | 3/2005 | Karim et al. |

FOREIGN PATENT DOCUMENTS

| | | |
|---|---|---|
| GB | 2-267291 | 12/1993 |
| JP | 2-058836 A | 2/1990 |
| JP | 7-161703 A | 6/1995 |

OTHER PUBLICATIONS

Alonso, J.C. et al., "High rate-low temperature deposition of silicon dioxide films by remote plasma enhanced chemical vapor deposition using silicon tetrachloride." Journal of Vacuum Science & Technology A: Vacuum, Surfaces, and Films, Nov. 1995, vol. 13, Issue 6, pp. 2924-2929.

Bar-Ilan et al., "A comparative study of sub-micron gap filing and planarization techniques", SPIE vol. 2636, Oct. 1996,. 277-288.

Broomfiled et al., "HDP Dielectric BEOL Gapfill: A Process for Manufacturing", IEEE/SEMI Advanced Semiconductor Manufacturing Conference 1996, pp. 255-258.

Conti et al., "Processing methods to fill High aspect ratio gaps without premature constriction," DUMIC Conference, Feb. 8-9, 1999, pp. 201-209.

Horike et al., "High rate and highly selective SI02 etching employing inductively coupled plasma and discussion on reaction kinetics", JVST A 13(3) May/Jun. 1995, pp. 801-809.

Kuo et al., "Thick SiO2 films obtained by plasma-enhanced chemical vapor deposition using hexamethyldisilazane, Carbon dioxide and hydrogen", Journal of The Electrochemical Society, 147(7) 2000 p. 2679-2684.

Lee, B. et al., "Dielectric Planarization Techniques For Narrow Pitch Multilevel Interconnects," V-MIC Conference, IEEE, pp. 85-92, Jun. 15-16, 1987.

Lee et al., "Low Temperature Silicon Nitride and Silicon Dioxide Film Processing by Inductively Coupled Please Chemical Vapor Deposition" JECS; 147(4) 2000, pp. 1481-1486.

Lim et al., "Gap-fill Performance and Film properties of PMD Films for thd 65 nm device Technology", IEEE International Symposium on Semiconductor Manufacturing, Sep. 30-Oct. 2, 2003, p. 435-438.

Meeks, Ellen et al., "Modeling of SiO2 Deposition In High Density Plasma Reactors And Comparisons Of Model Predictions With Experimental Measurements," J. Vac. Sci. Technol. A, vol. 16, No. 2, pp. 544-563, Mar./Apr. 1998.

Musaka, Katsuyuki et al., "Single Step Gap Filling Technology For Subhalf Micron Metal Spacings On Plasma Enhanced TEOS/O2 Chemical Vapor Deposition System," Extended Abstracts of the International Conference on Solid State Devices And Materials, pp. 510-512, 1993.

Nag et al., "Comparative Evaluation of gap- fill dielectrics in shallow trench isolation for sub-0.25 micron Technologies" IEDM 1996, 841-844.

Nalwa, H.S., Handbook of Low and High Dielectric Constant Materials and Their Applications, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).

Pal, "High quality voids free oxide deposition", Materials Chemistry and Physics, 44, 1996, pp. 1-8.

Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.

Peters, "Choices and challenges for shallow trench isolation", Semiconductor International, Apr. 1999, pp. 69-76.

Qian, L. Q. et al., "High Density Plasma Deposition And Deep Submicron Gap Fill With Low Dielectric Constant SiOF Films," DUMIC Conference, ISMIC, pp. 50-58, 1995.

Takahashi et al., "The Effect of Gas-phase additives C2H4, C2H6 and C2H2 on SIH4/O2 chemical vapor deposition". Journal of the Electrochemical Society, 143 (4) Apr. 1996, pp. 1355-1361.

Takeishi et al., "Fluorocarbon films deposited by PECVD with high thermal resistance and low dielectric constants." DUMIC 1996, pp. 71-77.

Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.

Vassiliev, "Void-free pre-metal dielectric gap- fill capability with CVD films for subquarter-micron ULSI" DUMIC, Feb. 28-29, 2000, pp. 121-132.

Vassiliev, V.Y. et al., "Trends In Void-Free Pre-Metal CVD Dielectrics," Solid State Technology, pp. 129-130, 132, 134, 138, Mar. 2001.

Xia et al., "High Aspect Ratio Trench Filling Using Two-Step Subatmospheric Chemical Vapor Deposited Borophosphosilicate Glass for <0.18 μm Device Application" JECS, 146 (5), 1999, p. 1884-1888.

Xia et al., "High Temperature Subatmospheric Chemical Vapor Deposited Undoped Silicate Glass," JECS 146 (3) 1999, pp. 1181-1185.

Yota et al., "Advanced passivation layer using high-density plasma CVD oxide for 0.25 micron CMOS Technology" DUMIC, Feb. 16-17, 1998,pp. 185-192.

Yota et al., "Extendibility of ICP high-density plasma CVD for use as Intermetal dielectric and passivation layers for 0.18 micron technolgy," DUMIC Feb. 8-9, 1999, pp. 71-82.

* cited by examiner

IN-SITU-ETCH-ASSISTED HDP DEPOSITION

CROSS-REFERENCE TO RELATED APPLICATIONS

This application is a continuation of U.S. patent application Ser. No. 11/089,874, entitled "IN-SITU-ETCH-ASSISTED HDP DEPOSITION USING $SiF_4$," filed Mar. 25, 2005 now U.S. Pat. No. 7,049,211 by M. Ziaul Karim et al., which is a continuation of U.S. patent application Ser. No. 10/655,230, entitled "IN-SITU-ETCH-ASSISTED HDP DEPOSITION USING $SiF_4$ AND HYDROGEN," filed Sep. 3, 2003 now U.S. Pat. No. 6,903,031 by M. Ziaul Karim, the entire disclosures of both of which are incorporated herein by reference for all purposes.

BACKGROUND OF THE INVENTION

One of the primary steps in the fabrication of modern semiconductor devices is the formation of a thin film on a semiconductor substrate by chemical reaction of gases. Such a deposition process is referred to generally as chemical vapor deposition ("CVD"). Conventional thermal CVD processes supply reactive gases to the substrate surface, where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared with conventional thermal CVD processes. These advantages are further exploited by high-density-plasma ("HDP") CVD techniques, in which a dense plasma is formed at low vacuum pressures so that the plasma species are even more reactive.

Any of these CVD techniques may be used to deposit conductive or insulative films during the fabrication of integrated circuits. For applications such as the deposition of insulating films as premetal or intermetal dielectric layers in an integrated circuit or for shallow trench isolation, one important physical property of the CVD film is its ability to fill gaps completely between adjacent structures without leaving voids; this property is referred to as the film's gapfill capability. Gaps that may require filling include spaces between adjacent raised structures such as transistor gates, conductive lines, etched trenches, or the like.

As semiconductor device geometries have decreased in size over the years, the ratio of the height of such gaps to their width, the so-called "aspect ratio," has increased dramatically. Gaps having a combination of high aspect ratio and a small width present a particular challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation such as by trapping undesirable impurities. The semiconductor industry has accordingly been searching aggressively for techniques that may improve gapfill capabilities, particularly with high-aspect-ratio small-width gaps.

BRIEF SUMMARY OF THE INVENTION

Embodiments of the invention thus provide a process for depositing an undoped silicon oxide film on a substrate that provides good gapfill characteristics. The process comprises an in situ etch-assisted deposition process in which the etchant is provided by $SiF_4$, together with $H_2$ to control the deposition to etch ratio, to reduce fluorine concentration in the deposited film, and to provide other benefits. An HDP CVD process is used in which the temperature of the substrate is allowed to be sufficiently high to prevent formation of a fluorinated silicon oxide layer.

Thus, in embodiments of the invention, a method is provided for depositing an undoped silicon oxide film on a substrate disposed in a process chamber. A process gas comprising $SiF_4$, $H_2$, a silicon source, and an oxidizing gas reactant is flowed into the process chamber. A plasma having an ion density of at least $10^{11}$ ions/cm$^3$ is formed from the process gas. The undoped silicon oxide film is deposited over the substrate with the plasma using a process that has simultaneous deposition and sputtering components. A temperature of the substrate during such depositing is greater than 450° C.

In some such embodiments, the temperature of the substrate may be substantially between 500 and 800° C., while in other such embodiments, the temperature of the substrate may be substantially between 700 and 800° C. The silicon source may comprise $SiH_4$, in which case a ratio of a flow rate of $SiF_4$ to a flow rate of $SiH_4$ may be substantially between 0.5 and 3.0. The oxidizing gas reactant may comprise $O_2$. In some such instances, the flow rate of $H_2$ may be less than 1500 sccm. More generally, the flow rate of $O_2$ may be greater than a factor times a sum of the flow rate of $SiF_4$ and the flow rate of $SiH_4$. This factor is less than about 1.8 for a flow rate of $H_2$ to the process chamber less than about 300 sccm and is between about 1.8 and 3.0 for a flow rate of $H_2$ to the process chamber greater than about 300 sccm. In some embodiments, the process gas may also comprise an inert gas, such as He or Ar.

Deposition of the silicon oxide film may form part of a multideposition process, such as a dep/etch/dep process. In such an instance, the undoped silicon oxide film may be a first portion of an undoped silicon oxide layer, with the method further comprising depositing a second portion of the undoped silicon oxide layer over the substrate. One of the first and second portions of the undoped silicon oxide layer is etched between depositing the undoped silicon oxide film and depositing the second portion of the undoped silicon oxide layer. In one embodiment, depositing the second portion of the undoped silicon oxide layer is performed before the etching and depositing the undoped silicon oxide film is performed after the etching. Depositing the second portion of the undoped silicon oxide layer may be performed similarly to depositing the undoped silicon oxide film, i.e. by flowing a second process gas comprising $SiF_4$, $H_2$, the silicon source, and the oxidizing gas reactant, with a second plasma being formed from the second process gas to deposit the second portion at a temperature greater than 450° C.

A further understanding of the nature and advantages of the present invention may be realized by reference to the remaining portions of the specification and the drawings.

DETAILED DESCRIPTION OF THE INVENTION

Figure 1A:
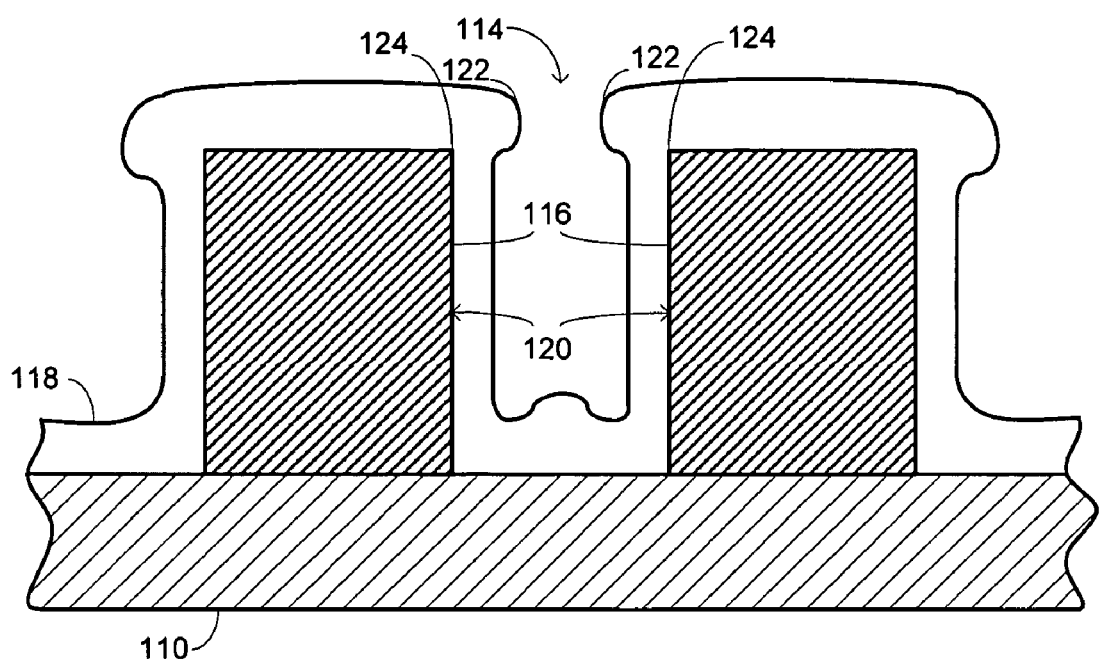
FIGS. 1A and 1B are schematic cross-sectional drawings illustrating the formation of a void during a gapfill process.

Embodiments of the invention pertain to a high-density-plasma chemical-vapor-deposition ("HDP-CVD") process for depositing undoped silicon oxide films or layers in shallow trench isolation ("STI"), premetal dielectric ("PMD"), intermetal dielectric ("IMD"), and other applications. In the drawings, references to undoped silicon oxide are sometimes made with the acronym "USG," which refers to "undoped silicate glass." Embodiments of the invention permit the dielectric material to be deposited with substantially 100% gapfill for integrated circuits having minimum feature sizes of 0.10 µm or less; bottom-up gapfill may be achieved inside very aggressive trenches having aspect ratios greater than 5.5:1. As used herein, the terms "film" and "layer" are intended to refer interchangeably to a thickness of material, although in describing embodiments in which material is deposited with interleaved deposition and etching steps, the completed structure is sometimes referred to as a layer, with the material deposited in each deposition step referred to as a film comprised by that layer. Processes that include interleaved deposition and etching steps are sometimes referred to as "deposition/etch/deposition" or "dep/etch/dep" processes.

Figure 1B:
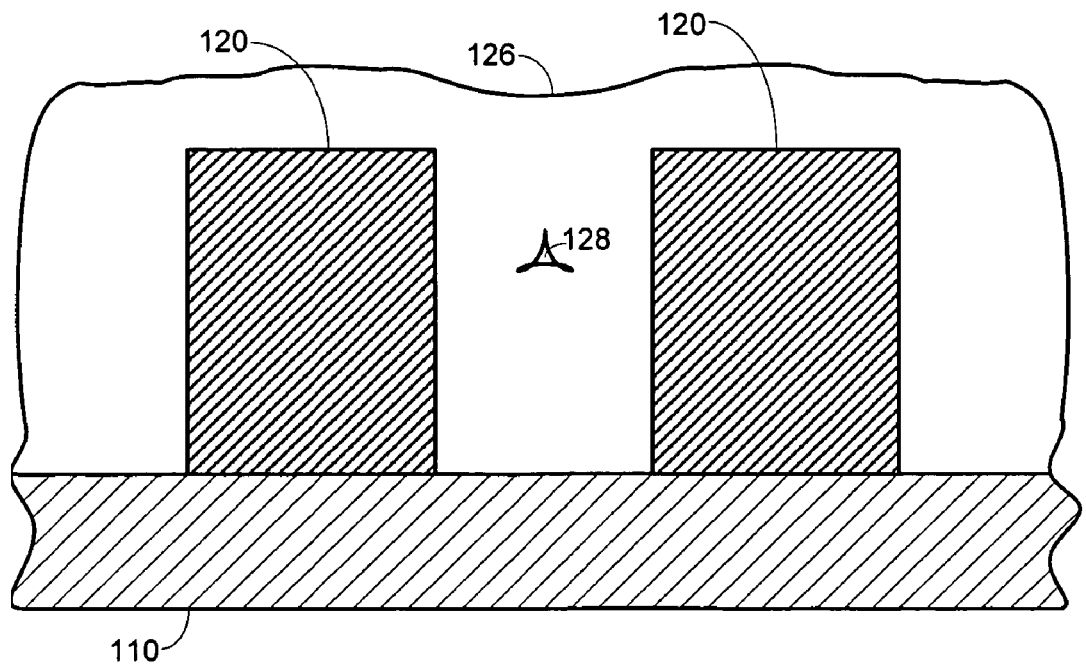

The gapfill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric layer 126 shown in FIG. 1B, preventing deposition into an interior void 128.

CVD deposition of undoped silicon oxide films typically proceeds by flowing a process gas into a process chamber with the process gas comprising a silicon source and an oxidizing gas reactant. The silicon source typically comprises a silane such as $SiH_4$ and the oxidizing gas reactant typically comprises $O_2$. Sometimes an inert gas such as Ar may also be included as a fluent gas. Improved gapfill characteristics have generally been achieved using HDP-CVD because the high density of ionic species in the plasma during an HDP-CVD process causes there to be sputtering of a film even while it is being deposited. This combination of simultaneous sputtering and deposition tends to keep the gap open during deposition, although there remain limits to gapfill capability with such processes.

The inventors have discovered that the effects of including $SiF_4$ and including $H_2$ during the deposition combine synergistically to improve gapfill capability of HDP-CVD deposition of undoped silicon oxide. The supply of fluorine ions in the plasma by including $SiF_4$ acts as an in situ etchant to complement the natural sputtering of the HDP-CVD process, but minimizes aggressive components of the etching. Such aggressive components, which are produced when nitrofluorinated etching gases such as $NF_3$ or carbofluorinated etching gases such as $C_2F_6$, $C_3F_8$, or $CF_4$, are used as in situ etchants are undesirable because they may cause corner clipping of structural features defining the gap being filled. Such corner clipping occurs when the aggressive etch acts at regions of the gap profile where deposition components are relatively low, e.g. at the top corners of the gap profile, and may cause significant damage to structural features that define the gap. In some instances, such structural features may include a thin SiN or SiC liner that may be used in some processes to line a gap or trench. The use of $SiF_4$ reduces such aggressive etch components and reduces the possibility of corner clipping even while providing good bottom-up gapfill capabilities for appropriate relative flow rates of the $SiF_4$ and silicon source as described below.

The use of $H_2$ also acts to reduce the possibility of corner clipping by controlling the relative deposition-to-etch ratio of the process gas. In particular, the $H_2$ also reduces the concentration of fluorine atoms in the plasma to control aggressive etch components and also acts to reduce the incorporation of fluorine into the deposited film. In addition, the $H_2$ acts to reduce redeposition of fluorine-rich material and eliminates the accumulation of excess fluorine at redeposition sites that is typical of in situ etch-assisted ("ISEA") processes. It also reduces the possibility of metal contamination in the film that may result from etching of material from the process chamber, such as Al contamination.

Figure 2A:
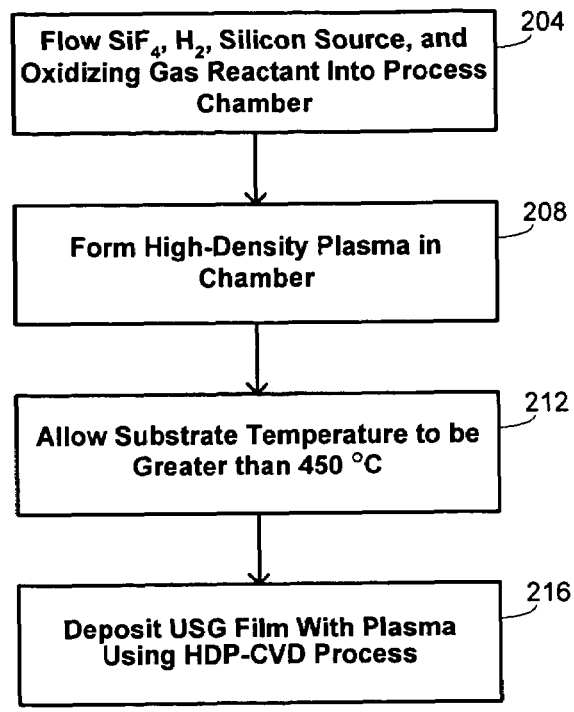
FIGS. 2A and 2B are flow diagrams illustrating methods for depositing an undoped silicon oxide film or layer to fill a gap in embodiments of the invention.

The resulting process is summarized for one embodiment with the flow diagram shown in FIG. 2A. At block 204, the process gas comprising $SiF_4$, $H_2$, the silicon source, and the oxidizing gas reactant are flowed into the process chamber. Suitable flow rates for the different precursor gases may vary depending on specific applications and on the design of the chamber in which the deposition is performed. In an embodiment in which the silicon source comprises $SiH_4$ and the oxidizing gas reactant comprises $O_2$, suitable flow rates F are as follows: for $SiH_4$, the flow rate $F(SiH_4)$ for the chamber design described below may be between about 15 and 100 sccm; for $O_2$, the flow rate $F(O_2)$ may be between about 25 and 500 sccm; for $SiF_4$, the flow rate $F(SiF_4)$ may be between about 15 and 100 sccm; and for $H_2$, the flow rate $F(H_2)$ may be between about 50 and 1000 sccm.

While these ranges set forth broad parameters for the flow rates, it is generally desirable for the flow rates for each of the precursor gases not to be set independently, but to be determined relative to each other. For example, in one set of embodiments, the flow rate for $SiF_4$ divided by the flow rate for $SiH_4$, $F(SiF_4)/F(SiH_4)$ is between about 0.5 and 3.0. In one such embodiment, the flow rates for $SiF_4$ and for $SiH_4$ are substantially equal. The flow rate for $O_2$ may be related both to the flow rate of $H_2$ and to the combined flow rate of $SiF_4$ and $SiH_4$ as follows:

$$F(O_2)=\alpha[F(H_2)][F(SiF_4)+F(SiH_4)],$$

where the factor $\alpha$ varies depending on the flow rate of $H_2$. When the flow rate of $H_2$ is low, i.e. less than about 300 sccm, the factor $\alpha$ may be less than about 1.8, but when the flow rate of $H_2$ is high, i.e. greater than about 300 sccm, the factor $\alpha$ may be between 1.8 and 3.0. The variation in the factor $\alpha$ reflects the fact that higher $O_2$ flow rates are appropriate relative to the total $SiF_4$ and $SiH_4$ flow rates when the $H_2$ flow rate is increased.

In some embodiments, an inert gas may also be supplied as a component of the process gas, such as a flow of He, Ne, or Ar. The level of sputtering provided by the $H_2$ or the inert gas is inversely related to their molecular or atomic mass, with $H_2$ being used because it provides even less sputtering that He. Inclusion of an inert gas with the $H_2$ may, however, provides better deposition uniformity than use of $H_2$ alone and may permit a significant cost saving. These benefits are realized even where the amount of $H_2$ used in the premixture is significantly greater than the amount of the inert gas. For example, in one embodiment, the premixture comprises greater than 95 wt. % $H_2$ and in another embodiment comprises greater than 99 wt. % $H_2$.

At block 208, a high-density plasma is formed in the process chamber from the process gas. The ion density of such a high-density plasma is generally greater than $10^{11}$ ions/cm$^3$. In embodiments of the invention, the substrate temperature is allowed to reach a relatively high temperature, i.e. greater than 450° C. as indicated at block 216. Such a high temperature may be provided by the plasma with relatively little, if any, cooling of the substrate. In some embodiments, the temperature of the substrate is allowed to remain substantially between 500 and 800° C. or substantially between 700 and 800° C. during deposition. Such a high temperature results in relatively little fluorine being incorporated into the film when the film is deposited with the plasma using the HDP-CVD process as indicated at block 216. The fluorine concentration in the resulting film is generally less than 1.0 at. % and may be as low as 0.008 at. %. In this way, an undoped silicon oxide film may be deposited, even though the chemistry of the reaction is similar to a chemistry that may be used in other HDP-CVD processes to deposit fluorinated silicon oxide. Such fluorinated silicon oxide films are usually formed with a substrate temperature of about 350° C., typically have a much higher fluorine concentration in the range of 4-8 at. %, and do not enjoy the benefits of improved bottom-up gapfill provided by the combination of limitations disclosed herein. It should thus be recognized that as used herein, an "undoped silicon oxide film" may comprise some impurities in addition to the silicon and oxygen that make up the film, but that the concentration of such impurities is small. In particular, the fluorine concentration is less than 1.0 at. %.

The specific order of the blocks shown in FIG. 2A is not intended to be restrictive and in other embodiments, the corresponding steps may be performed in an alternative order. For example, allowing the temperature to reach a temperature greater than 450° C. as indicated at block 216 may be performed prior to flowing the gas reactants into the process chamber at block 204 and/or prior to forming the high-density plasma as indicated at block 208. Furthermore, the inclusion of specific blocks in FIG. 2A is not intended to be restrictive since additional steps may be performed in alternative embodiments.

Figure 2B:
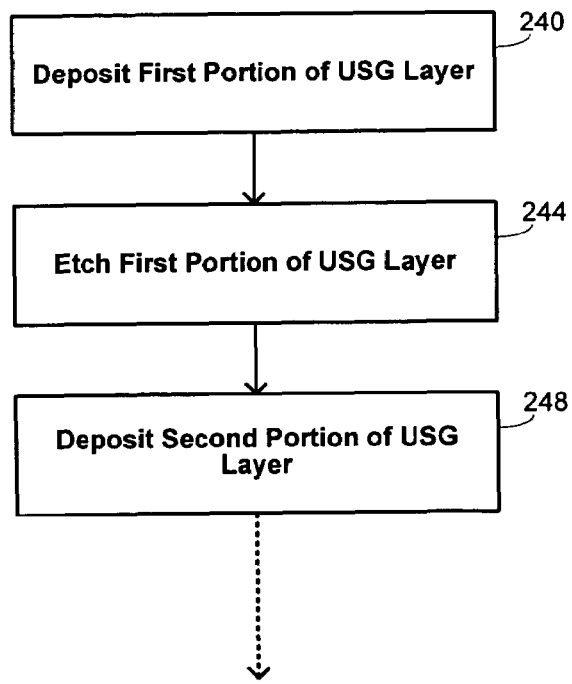

In some embodiments of the invention, the film deposition described in connection with FIG. 2A may correspond to one deposition step in a dep/etch/dep process. Such a dep/etch/dep process is illustrated with the flow diagram of FIG. 2B, in which deposition of first and second portions of the undoped silicon oxide as indicated at blocks 240 and 248 are separated by an intermediate etching of the first portion at block 244. Such etching may be performed in situ or remotely. In some instances, the etching may be also be preceded by a cooling step to lower the temperature of the substrate below about 250° C. and thereby provide better etch control. Such cooling may be performed, for example, by helium backside cooling of the substrate, among other methods. In certain in situ embodiments, a nitrofluorinated gas such as $NF_3$ or a carbofluorinated gas such as $C_2F_6$, $C_3F_8$, or $CF_4$, is flowed into the process chamber. Approximately 5-15% of the deposited thickness of the silicon oxide film may be removed during the etching step, although the amount removed may vary at different points according to the profile of the film. At least one of the deposition steps is performed with the deposition method described in connection with FIG. 2A. In a specific embodiment, that deposition method is used for the second of the deposition steps 248 shown in FIG. 2B. The dashed arrow in FIG. 2B is intended to indicate that the interleaving of depositing and etching steps may continue indefinitely, with more interleaved steps being used for more aggressive gapfill applications.

Figure 3:
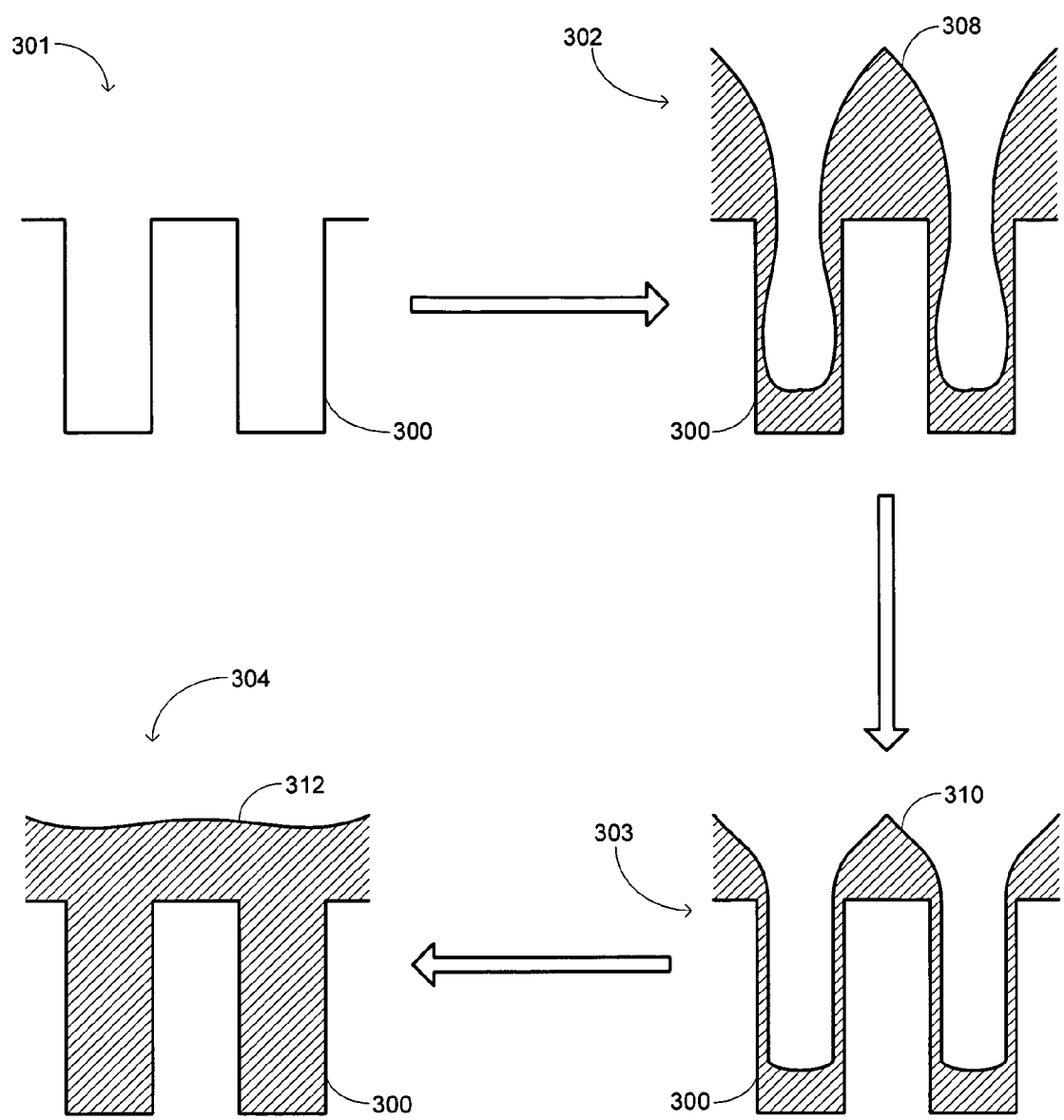
FIG. 3 provides schematic cross-sectional drawings illustrating how a high-aspect-ratio feature may be filled using a dep/etch/dep process according to an embodiment of the invention.

In embodiments of the invention that use a dep/etch/dep process, care is taken not to damage the underlying structures during the etching step 244. This may be accomplished with a combination of effects that include ensuring that sufficient material is deposited during the first deposition step 240 to protect the underlying structures and that the etching conditions during the etching step 244 do not etch away so much material that the structures are exposed. The patterns that result from process parameters that are used to achieve this combination of effects are illustrated schematically in FIG. 3.

The initial substrate structure 301 is shown schematically as including features 300 that are to be filled with a dielectric material. The process conditions for the first deposition may result in the formation of a significant cusp 308, as shown for intermediate structure 302, with dielectric material being deposited more thickly near the corners of the underlying structures than on the sidewalls. Structure 302 may result from deposition of a first film using the method described in connection with FIG. 2A. The cusp feature is protective during the subsequent etching step, which results in structure 303. Performing the etch anisotropically, such as by applying a bias during a reactive etch, helps to shape the deposited layer 310 so that the basic shape of the original features 300 are retained, but are less severe, with the corners of the underlying structures remaining unexposed. When the final deposition is performed, the features 300 may then be filled completely with dielectric material 312, such as shown schematically with structure 304.

Figure 4A:
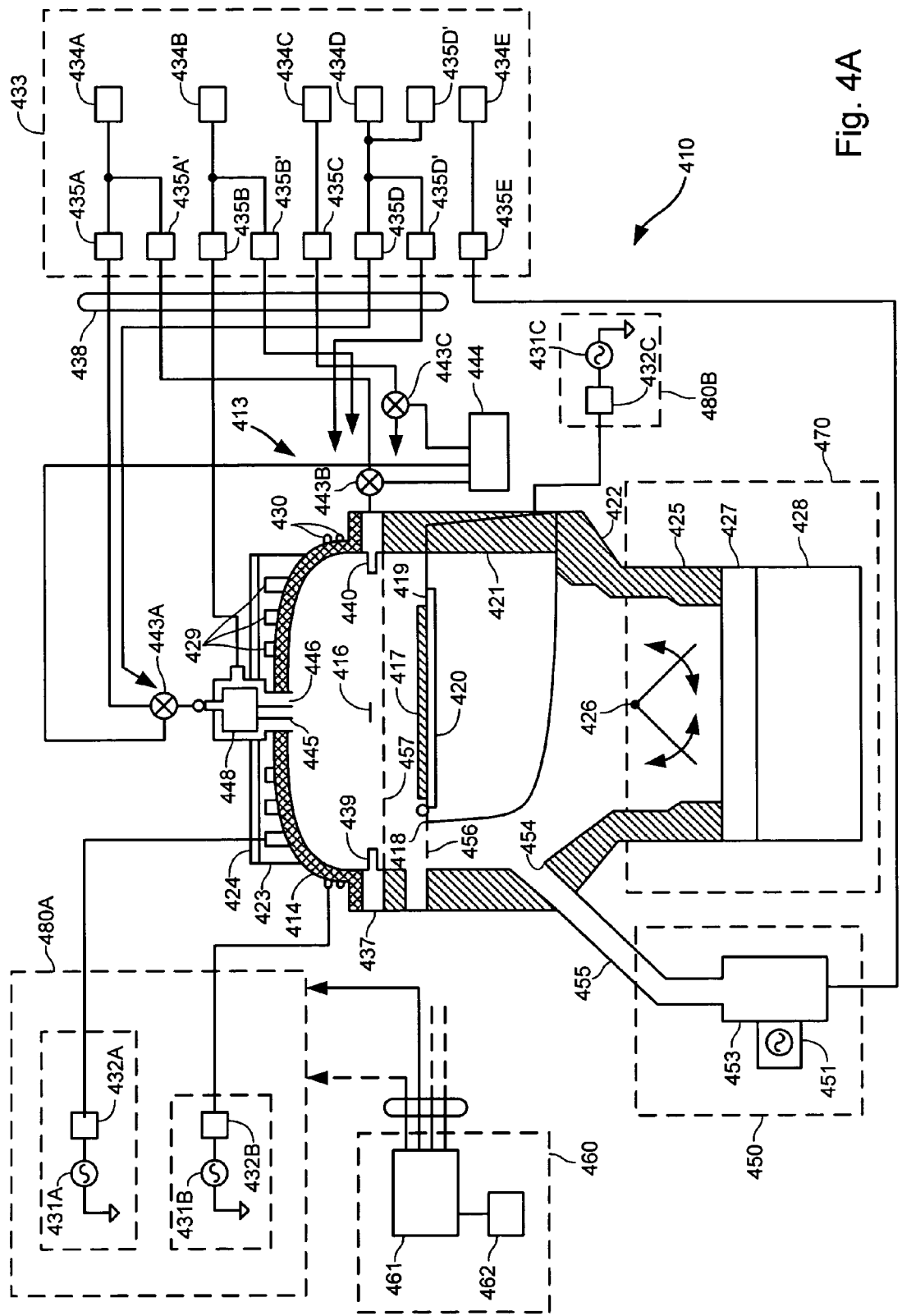
FIG. 4A is a simplified diagram of one embodiment of a high-density-plasma chemical-vapor deposition system according to the present invention.

The methods described above may be implemented with a variety of HDP-CVD systems, some of which are described in detail in connection with FIGS. 4A-4D. FIG. 4A schematically illustrates the structure of such an HDP-CVD system 410 in one embodiment. The system 410 includes a chamber 413, a vacuum system 470, a source plasma system 480A, a bias plasma system 480B, a gas delivery system 433, and a remote plasma cleaning system 450.

The upper portion of chamber 413 includes a dome 414, which is made of a ceramic dielectric material, such as aluminum oxide or aluminum nitride. Dome 414 defines an upper boundary of a plasma processing region 416. Plasma processing region 416 is bounded on the bottom by the upper surface of a substrate 417 and a substrate support member 418.

A heater plate 423 and a cold plate 424 surmount, and are thermally coupled to, dome 414. Heater plate 423 and cold plate 424 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 413 includes a body member 422, which joins the chamber to the vacuum system. A base portion 421 of substrate support member 418 is mounted on, and forms a continuous inner surface with, body member 422. Substrates are transferred into and out of chamber 413 by a robot blade (not shown) through an insertion/removal opening (not shown) in the side of chamber 413. Lift pins (not shown) are raised and then lowered under the control of a motor (also not shown) to move the substrate from the robot blade at an upper loading position 457 to a lower processing position 456 in which the substrate is placed on a substrate receiving portion 419 of substrate support member 418. Substrate receiving portion 419 includes an electrostatic chuck 420 that secures the substrate to substrate support member 418 during substrate processing. In a preferred embodiment, substrate support member 418 is made from an aluminum oxide or aluminum ceramic material.

Vacuum system 470 includes throttle body 425, which houses twin-blade throttle valve 426 and is attached to gate valve 427 and turbo-molecular pump 428. It should be noted that throttle body6 25 offers minimum obstruction to gas flow, and allows symmetric pumping. Gate valve 427 can isolate pump 428 from throttle body 425, and can also control chamber pressure by restricting the exhaust flow capacity when throttle valve 426 is fully open. The arrangement of the throttle valve, gate valve, and turbo-molecular pump allow accurate and stable control of chamber pressures from between about 1 millitorr to about 2 torr.

The source plasma system 480A includes a top coil 429 and side coil 430, mounted on dome 414. A symmetrical ground shield (not shown) reduces electrical coupling between the coils. Top coil 429 is powered by top source RF (SRF) generator 431A, whereas side coil 430 is powered by side SRF generator 431B, allowing independent power levels and frequencies of operation for each coil. This dual coil system allows control of the radial ion density in chamber 413, thereby improving plasma uniformity. Side coil 430 and top coil 429 are typically inductively driven, which does not require a complimentary electrode. In a specific embodiment, the top source RF generator 431A provides up to 2,500 watts of RF power at nominally 2 MHz and the side source RF generator 431B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 480B includes a bias RF ("BRF") generator 431C and a bias matching network 432C. The bias plasma system 480B capacitively couples substrate portion 417 to body member 422, which act as complimentary electrodes. The bias plasma system 480B serves to enhance the transport of plasma species (e.g., ions) created by the source plasma system 480A to the surface of the substrate. In a specific embodiment, bias RF generator provides up to 5,000 watts of RF power at 13.56 MHz.

RF generators 431A and 431B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 432A and 432B match the output impedance of generators 431A and 431B with their respective coils 429 and 430. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 433 provides gases from several sources, 434A-434E chamber for processing the substrate via gas delivery lines 438 (only some of which are shown). As would be understood by a person of skill in the art, the actual sources used for sources 434A-434E and the actual connection of delivery lines 438 to chamber 413 varies depending on the deposition and cleaning processes executed within chamber 413. Gases are introduced into chamber 413 through a gas ring 437 and/or a top nozzle 445.

Figure 4B:
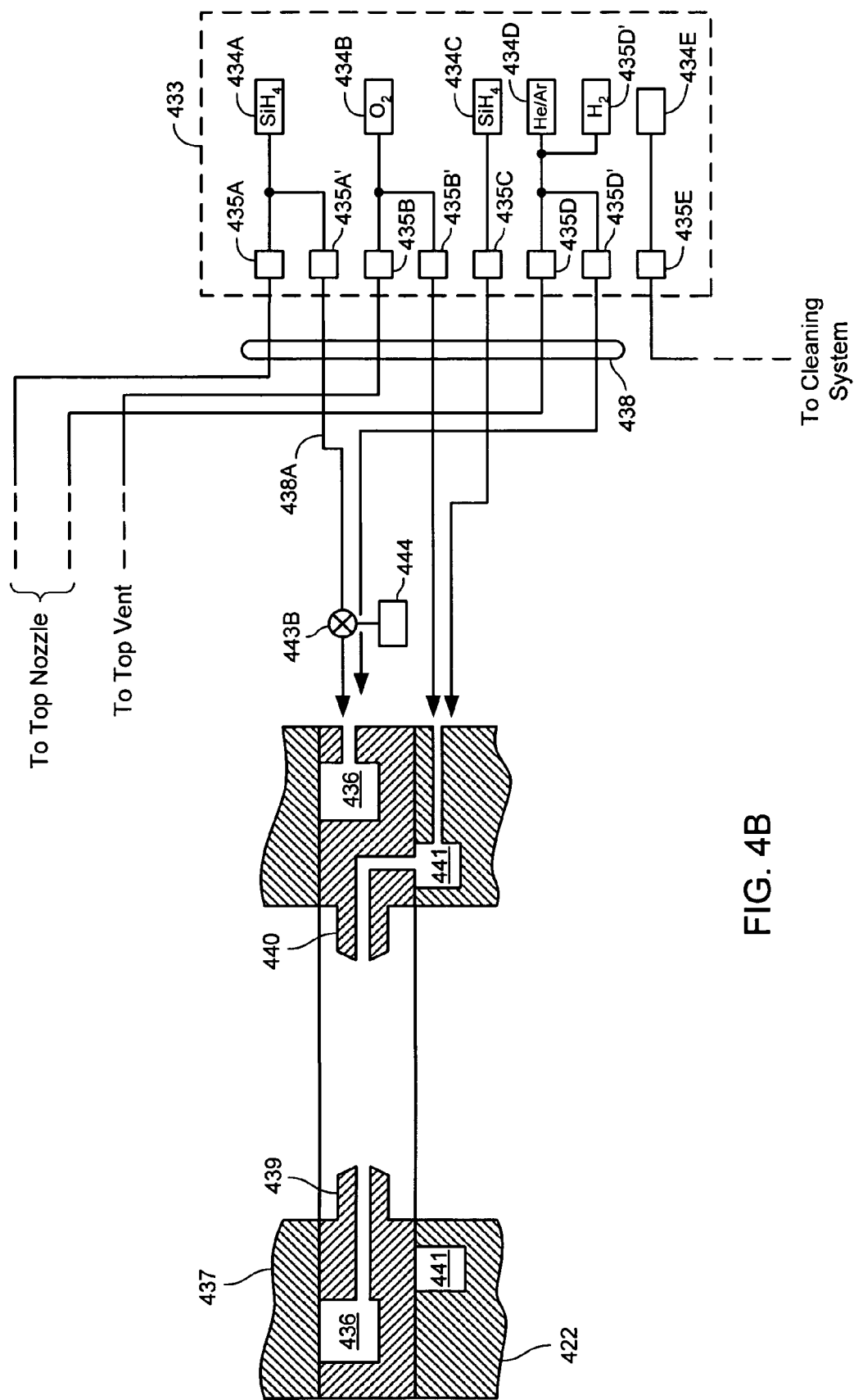
FIG. 4B is a simplified cross section of a gas ring that may be used in conjunction with the exemplary CVD processing chamber of FIG. 4A.

FIG. 4B is a simplified, partial cross-sectional view of chamber 413 showing additional details of gas ring 437.

In one embodiment, first and second gas sources, 434A and 434B, and first and second gas flow controllers, 435A' and 435B', provide gas to ring plenum 436 in gas ring 437 via gas delivery lines 438 (only some of which are shown). Gas ring 437 has a plurality of source gas nozzles 439 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 437 has 12 source gas nozzles made from an aluminum oxide ceramic.

Gas ring 437 also has a plurality of oxidizer gas nozzles 440 (only one of which is shown), which in a preferred embodiment are co-planar with and shorter than source gas nozzles 439, and in one embodiment receive gas from body plenum 441. In some embodiments it is desirable not to mix source gases and oxidizer gases before injecting the gases into chamber 413. In other embodiments, oxidizer gas and source gas may be mixed prior to injecting the gases into chamber 413 by providing apertures (not shown) between body plenum 441 and gas ring plenum 436. In one embodiment, third, fourth, and fifth gas sources, 434C, 434D, and 434D', and third and fourth gas flow controllers, 435C and 435D', provide gas to body plenum via gas delivery lines 438. Additional valves, such as 443B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 443B, to isolate chamber 413 from delivery line 438A and to vent delivery line 438A to vacuum foreline 444, for example. As shown in FIG. 4A, other similar valves, such as 443A and 443C, may be incorporated on other gas delivery lines. Such three-way valves may be placed as close to chamber 413 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 4A, chamber 413 also has top nozzle 445 and top vent 446. Top nozzle 445 and top vent 446 allow independent control of top and side flows of the gases, which improves film uniformity and allows fine adjustment of the film's deposition and doping parameters. Top vent 446 is an annular opening around top nozzle 445. In one embodiment, first gas source 434A supplies source gas nozzles 439 and top nozzle 445. Source nozzle MFC 435A' controls the amount of gas delivered to source gas nozzles 439 and top nozzle MFC 435A controls the amount of gas delivered to top gas nozzle 445. Similarly, two MFCs 435B and 435B' may be used to control the flow of oxygen to both top vent 446 and oxidizer gas nozzles 440 from a single source of oxygen, such as source 434B. The gases supplied to top nozzle 445 and top vent 446 may be kept separate prior to flowing the gases into chamber 413, or the gases may be mixed in top plenum 448 before they flow into chamber 413. Separate sources of the same gas may be used to supply various portions of the chamber.

A remote microwave-generated plasma cleaning system 450 is provided to periodically clean deposition residues from chamber components. The cleaning system includes a remote microwave generator 451 that creates a plasma from a cleaning gas source 434E (e.g., molecular fluorine, nitrogen trifluoride, other fluorocarbons or equivalents) in reactor cavity 453. The reactive species resulting from this plasma are conveyed to chamber 413 through cleaning gas feed port 454 via applicator tube 455. The materials used to contain the cleaning plasma (e.g., cavity 453 and applicator tube 455) must be resistant to attack by the plasma. The distance between reactor cavity 453 and feed port 454 should be kept as short as practical, since the concentration of desirable plasma species may decline with distance from reactor cavity 453. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 420, do not need to be covered with a dummy wafer or otherwise protected, as may be required with an in situ plasma cleaning process. In one embodiment, this cleaning system is used to dissociate atoms of the etchant gas remotely, which are then supplied to the process chamber 413. In another embodiment, the etchant gas is provided directly to the process chamber 413. In still a further embodiment, multiple process chambers are used, with deposition and etching steps being performed in separate chambers.

System controller 460 controls the operation of system 410. In a preferred embodiment, controller 460 includes a memory 462, such as a hard disk drive, a floppy disk drive (not shown), and a card rack (not shown) coupled to a processor 461. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 431 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 465, and a light pen 466, as depicted in FIG. 4C.

Figure 4C:
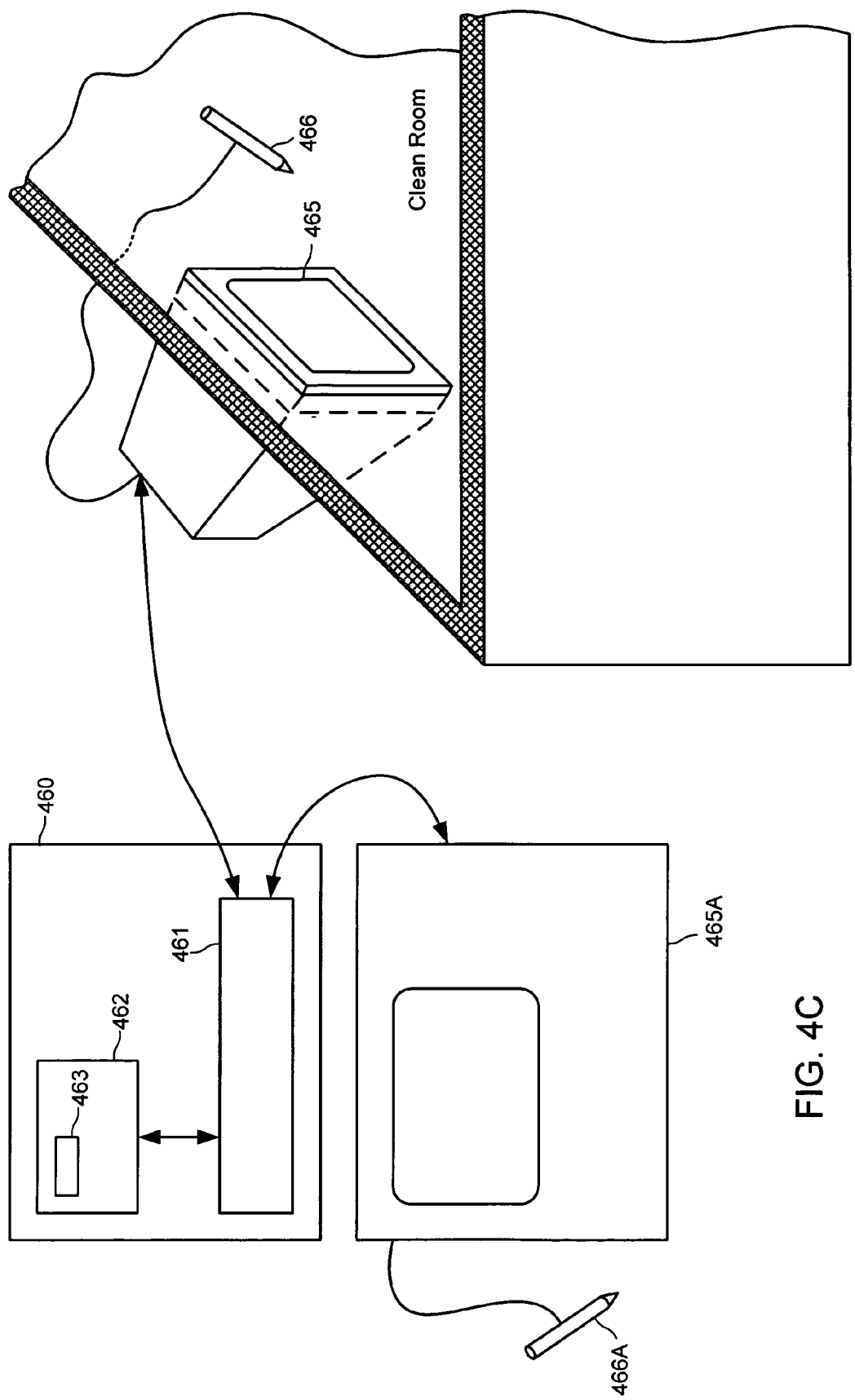
FIG. 4C is a simplified diagram of a monitor and light pen that may be used in conjunction with the exemplary CVD processing chamber of FIG. 4A.

FIG. 4C is an illustration of a portion of an exemplary system user interface used in conjunction with the exemplary CVD processing chamber of FIG. 4A. System controller 460 includes a processor 461 coupled to a computer-readable memory 462. Preferably, memory 462 may be a hard disk drive, but memory 462 may be other kinds of memory, such as ROM, PROM, and others.

System controller 460 operates under the control of a computer program 463 stored in a computer-readable format within memory 462. The computer program dictates the timing, temperatures, gas flows, RF power levels and other parameters of a particular process. The interface between a user and the system controller is via a CRT monitor 465 and a light pen 466, as depicted in FIG. 4C. In a preferred embodiment, two monitors, 465 and 465A, and two light pens, 466 and 466A, are used, one mounted in the clean room wall (665) for the operators and the other behind the wall (665A) for the service technicians. Both monitors simultaneously display the same information, but only one light pen (e.g. 466) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 4D:
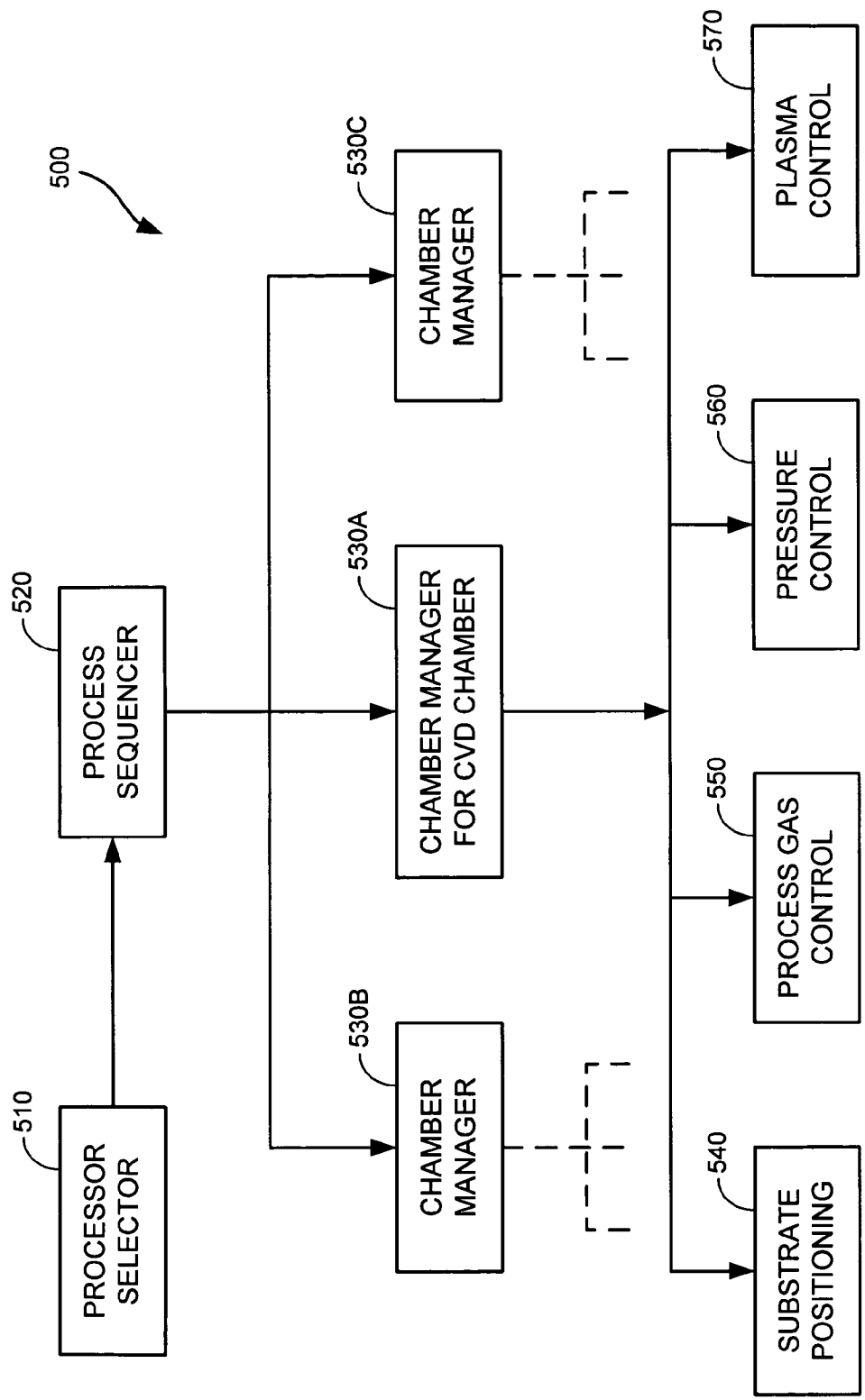
FIG. 4D is a flow chart of an exemplary process control computer program product used to control the exemplary CVD processing chamber of FIG. 4A.

FIG. 4D shows an illustrative block diagram of the hierarchical control structure of computer program 500. A user enters a process set number and process chamber number into a process selector subroutine 510 in response to menus or screens displayed on the CRT monitor by using the light pen interface. The process sets are predetermined sets of process parameters necessary to carry out specified processes, and are identified by predefined set numbers. Process selector subroutine 510 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 460, and the signals for controlling the process are output on the analog and digital output boards of system controller 460.

A process sequencer subroutine 520 comprises program code for accepting the identified process chamber and set of process parameters from the process selector subroutine 510 and for controlling operation of the various process chambers. Multiple users can enter process set numbers and process chamber numbers, or a single user can enter multiple process set numbers and process chamber numbers; sequencer subroutine 520 schedules the selected processes in the desired sequence. Preferably, sequencer subroutine 520 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 520 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 520 determines which process chamber and process set combination is going to be executed next, sequencer subroutine 520 initiates execution of the process set by passing the particular process set parameters to a chamber manager subroutine 530A-530C, which controls multiple processing tasks in chamber 413 and possibly other chambers (not shown) according to the process set sent by sequencer subroutine 520.

Examples of chamber component subroutines are substrate positioning subroutine 540, process gas control subroutine 550, pressure control subroutine 560, and plasma control subroutine 570. Those having ordinary skill in the art will recognize that other chamber control subroutines can be included depending on what processes are selected to be performed in chamber 413. In operation, chamber manager subroutine 530A selectively schedules or calls the process component subroutines in accordance with the particular process set being executed. Chamber manager subroutine 530A schedules process component subroutines in the same manner that sequencer subroutine 520 schedules the process chamber and process set to execute. Typically, chamber manager subroutine 530A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 4A and 4D. Substrate positioning subroutine 540 comprises program code for controlling chamber components that are used to load a substrate onto substrate support number 418. Substrate positioning subroutine 540 may also control transfer of a substrate into chamber 413 from, e.g., a plasma-enhanced CVD ("PECVD") reactor or other reactor in the multi-chamber system, after other processing has been completed.

Process gas control subroutine 550 has program code for controlling process gas composition and flow rates. Subroutine 550 controls the open/close position of the safety shut-off valves and also ramps up/ramps down the mass flow controllers to obtain the desired gas flow rates. All chamber component subroutines, including process gas control subroutine 550, are invoked by chamber manager subroutine 530A. Subroutine 550 receives process parameters from chamber manager subroutine 530A related to the desired gas flow rates.

Typically, process gas control subroutine 550 opens the gas supply lines, and repeatedly (i) reads the necessary mass flow controllers, (ii) compares the readings to the desired flow rates received from chamber manager subroutine 530A, and (iii) adjusts the flow rates of the gas supply lines as necessary. Furthermore, process gas control subroutine 550 may include steps for monitoring the gas flow rates for unsafe rates and for activating the safety shut-off valves when an unsafe condition is detected.

In some processes, an inert gas, such as argon, is flowed into chamber 413 to stabilize the pressure in the chamber before reactive process gases are introduced. For these processes, the process gas control subroutine 550 is programmed to include steps for flowing the inert gas into chamber 413 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 550 may include steps for bubbling a delivery gas such as helium through the liquid precursor in a bubbler assembly or for introducing the helium to a liquid injection valve. For this type of process, the process gas control subroutine 550 regulates the flow of the delivery gas, the pressure in the bubbler, and the bubbler temperature to obtain the desired process gas flow rates. As discussed above, the desired process gas flow rates are transferred to process gas control subroutine 550 as process parameters.

Furthermore, the process gas control subroutine 550 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 550 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 460 includes program code for controlling the pressure in chamber 413 by regulating the size of the opening of throttle valve 426 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 426 to a fixed position. Setting throttle valve 426 to a fixed position may eventually result in a steady-state pressure.

Alternatively, the chamber pressure may be measured, with a manometer for example, and the position of throttle valve 426 may be adjusted according to pressure control subroutine 560, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 560 is invoked, the desired, or target, pressure level is received as a parameter from chamber manager subroutine 530A. Pressure control subroutine 560 measures the pressure in chamber 413 by reading one or more conventional pressure manometers connected to the chamber; compares the measured value(s) to the target pressure; obtains proportional, integral, and differential (PID) values from a stored pressure table corresponding to the target pressure, and adjusts throttle valve 426 according to the PID values obtained from the pressure table. Alternatively, pressure control subroutine 560 may open or close throttle valve 426 to a particular opening size to regulate the pressure in chamber 413 to a desired pressure or pressure range.

Plasma control subroutine 570 comprises program code for controlling the frequency and power output setting of RF generators 431A and 431B and for tuning matching networks 432A and 432B. Plasma control subroutine 570, like the previously described chamber component subroutines, is invoked by chamber manager subroutine 530A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

EXAMPLE 1

To illustrate the gapfill capability provided with embodiments of the invention, experiments were performed with a substrate having a trench between adjacent raised surfaces to define a gap having an aspect ratio greater than 5.0:1. The following flow rates for a process in which the process gas during deposition comprised $SiH_4$, $O_2$, $SiF_4$, and $H_2$ provided a deposition rate of approximately 4700 Å/minute with a substrate temperature between 500 and 800° C.:

| Parameter | Flow Rate (sccm) |
|---|---|
| $F(SiH_4)$ | 33.5 |
| $F(SiF_4)$ | 37.0 |
| $F(H_2)$ | 65 |
| $F(O_2)$ | 160 |
| $F(SiF_4)/F(SiH_4)$ | 1.10 |
| $\alpha = F(O_2)/[F(SiF_4) + F(SiH_4)]$ | 2.3 |

Figure 5A:
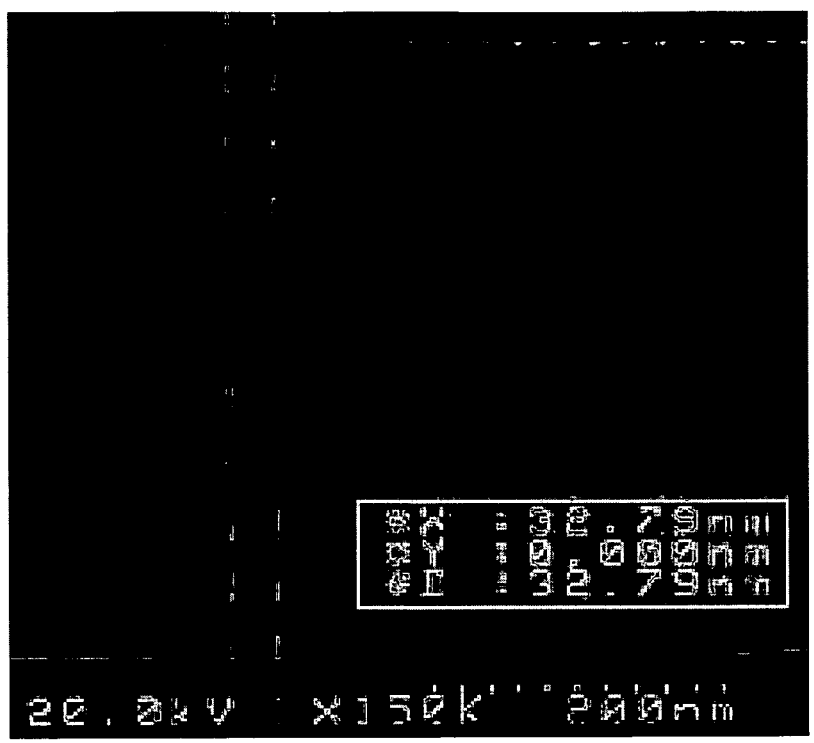
FIGS. 5A and 5B present micrograph images from a first experiment illustrating the gapfill capabilities of embodiments of the invention.
Figure 5B:
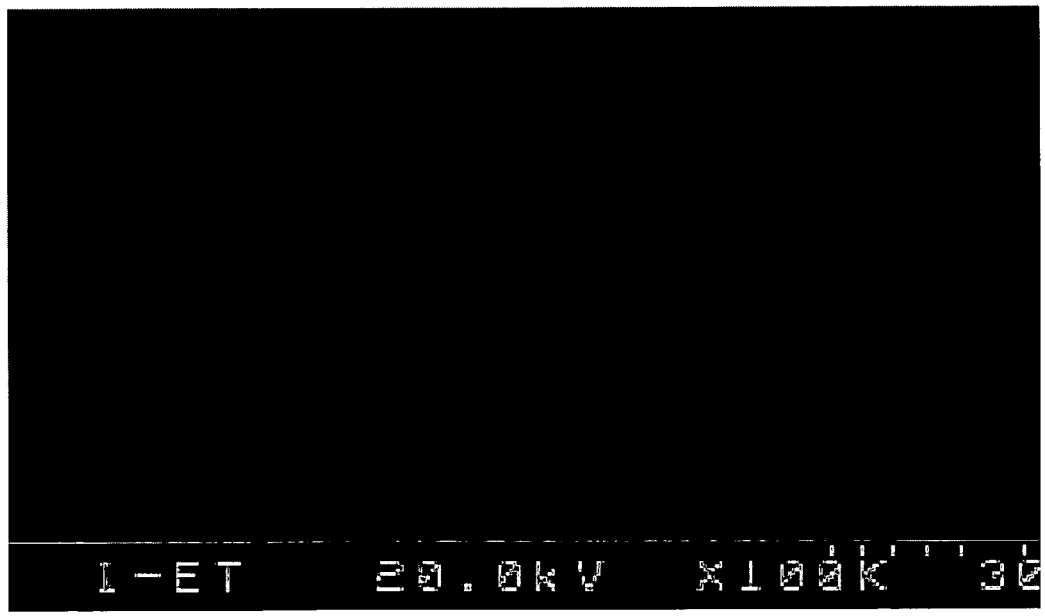

As noted in the table, the flow rates for this example fall within the parameter ranges discussed above. Micrographs provided in FIGS. 5A and 5B show that substantially 100% gapfill is achieved for the 5.0:1-aspect-ratio gap. For purposes of comparison, FIG. 5A provides a micrograph for a process using $SiH_4$, $NF_3$, and $O_2$ for the process gas, in which the gap was not adequately filled. The micrograph in FIG. 5B shows the results using the $SiH_4$, $SiF_4$, $O_2$, and $H_2$ process gas defined by the table, in which the gapfill capability is good. The fluorine concentration in the film produced with the process using the table parameters was less than 1.0 at. %. The methods of the invention may thus be used in a variety of undoped silicon oxide gapfill applications, including shallow-trench-isolation and premetal-dielectric gapfill applications.

EXAMPLE 2

To further illustrate the gapfill capability provided with embodiments of the invention, additional experiments were performed with a substrate having a trench between adjacent raised surfaces to define a gap also having an aspect ratio greater than 5.0:1. The following flow rates for a process in which the process gas during deposition comprised $SiH_4$, $O_2$, $SiF_4$, and $H_2$ provided a deposition rate of approximately 2600 Å/minute with a substrate temperature between 500 and 800° C.:

| Parameter | Flow Rate (sccm) |
|---|---|
| $F(SiH_4)$ | 13.0 |
| $F(SiF_4)$ | 20.0 |
| $F(H_2)$ | 620 |
| $F(O_2)$ | 85 |
| $F(SiF_4)/F(SiH_4)$ | 1.54 |
| $\alpha = F(O_2)/[F(SiF_4) + F(SiH_4)]$ | 2.57 |

Figure 6A:
FIGS. 6A and 6B present micrograph images from a second experiment illustrating the gapfill capabilities of embodiments of the invention.
Figure 6B:
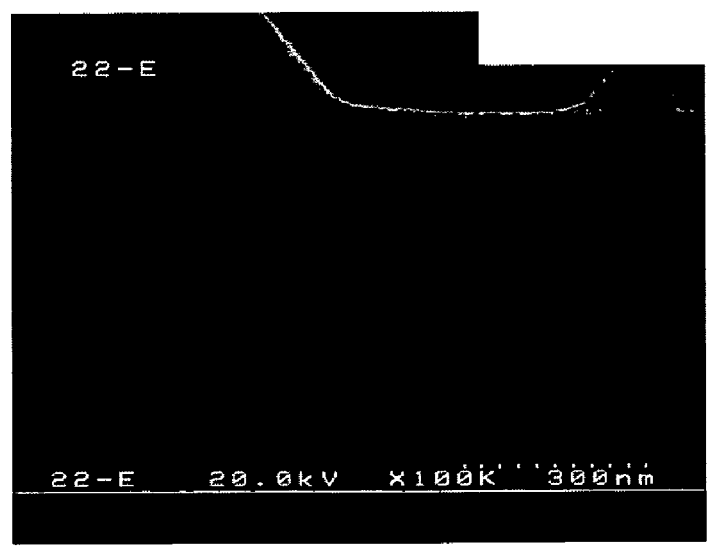

As noted in the table, the flow rates for this example also fall within the parameter ranges discussed above. Micrographs provided in FIGS. 6A and 6B show that substantially 100% gapfill is achieved for the 5.0:1-aspect-ratio gap. The micrographs in FIGS. 6A and 6B show results using the $SiH_4$, $SiF_4$, $O_2$, and $H_2$ process gas defined by the table, in which the gapfill capability is good with no corner clipping. The fluorine concentration in the film produced with the process using the table parameters was less than 1.0 at. %. The methods of the invention may thus be used in a variety of undoped silicon oxide gapfill applications, including shallow-trench-isolation and premetal-dielectric gapfill applications.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for depositing a silicon oxide film on a substrate disposed in a process chamber, the method comprising:

flowing a process gas comprising a halogen source, a fluent gas, a silicon source, and an oxidizing gas reactant into the process chamber, wherein the fluent gas comprises $H_2$ and has a flow rate to the process chamber less than 1500 sccm;

forming a plasma having an ion density of at least $10^{11}$ ions/cm$^3$ from the process gas; and depositing the silicon oxide film over the substrate with a halogen concentration less than 1.0 at. %, wherein:

depositing the silicon oxide film comprises depositing the silicon oxide film with the plasma using a process that has simultaneous deposition and sputtering components; and a flow rate of the halogen source to the process chamber to a flow rate of the silicon source to the process chamber is substantially between 0.5 and 3.0.

2. The method recited in claim 1 wherein the temperature of the substrate during such depositing is substantially between 500 and 800° C.

3. The method recited in claim 1 wherein the temperature of the substrate during such depositing is substantially between 700 and 800° C.

4. The method recited in claim 1 wherein the silicon source comprises $SiH_4$.

5. The method recited in claim 4 wherein the oxidizing gas reactant comprises $O_2$.

6. The method recited in claim 5 wherein the halogen source comprises a fluorine source.

7. The method recited in claim 6 wherein the halogen source comprises $SiF_4$.

8. The method recited in claim 1 wherein a flow rate of the oxidizing gas reactant to the process chamber is greater than a factor times a sum of the flow rate of the fluorine source and the flow rate of silicon source to the process chamber, the factor being less than about 1.8 for a flow rate of $H_2$ to the process chamber less than about 300 sccm and being between about 1.8 and 3.0 for a flow rate of $H_2$ to the process chamber greater than about 300 sccm.

9. The method recited in claim 1 wherein the fluent gas comprises an inert gas.

10. The method recited in claim 9 wherein the inert gas comprises He.

11. The method recited in claim 1 wherein the silicon oxide film is a first portion of a silicon oxide layer, the method further comprising:

depositing a second portion of the silicon oxide layer over the substrate with a halogen concentration less than 1.0 at. %; and etching one of the first and second portions of the silicon oxide layer between depositing the silicon oxide film and depositing the second portion of the silicon oxide layer.

12. The method recited in claim 11 wherein depositing the second portion of the silicon oxide layer is performed before the etching and depositing the silicon oxide film is performed after the etching.

13. The method recited in claim 11 wherein depositing the second portion of the silicon oxide layer comprises:

flowing a second process gas comprising the halogen source, the fluent gas, the silicon source, and the oxidizing gas reactant into the process chamber; and forming a second plasma having an ion density of at least $10^{11}$ ions/cm$^3$ from the second process gas.

* * * * *